United States Patent [19]

Westervelt et al.

[11] Patent Number: 4,785,234

[45] Date of Patent: Nov. 15, 1988

[54] DETERMINING ECCENTRICITY OF INSULATED WIRE

[75] Inventors: Dean C. Westervelt, Bullskin Twp., Fayette County; Allan I. Bennett, Murrysville Boro, both of Pa.

[73] Assignee: Westinghouse Electric Corp., Pittsburgh, Pa.

[21] Appl. No.: 61,769

[22] Filed: Jun. 15, 1987

[51] Int. Cl.$^4$ ............................................. G01R 27/26
[52] U.S. Cl. ........................................ 324/61 R; 29/593; 29/825; 33/550; 324/61 P; 324/513; 324/519; 324/541; 324/558; 340/686
[58] Field of Search ............... 324/61 R, 541, 544, 324/557, 558, 559, 61 P, 515, 513, 551, 519; 340/686, 680, 647, 870.37; 33/550, 543; 82/14 D, 45; 29/593, 825; 73/160

[56] References Cited

U.S. PATENT DOCUMENTS

| | | | |
|---|---|---|---|
| 2,177,528 | 10/1939 | Kidd | 324/61 P |
| 2,274,735 | 3/1942 | Peters et al. | 324/61 R |
| 2,604,512 | 7/1952 | Bacon et al. | 324/61 R |
| 2,721,975 | 10/1955 | Wojciechowski | 324/61 R |
| 2,721,976 | 10/1955 | Wojciechowski | 324/61 P |
| 2,898,550 | 8/1959 | Fischer | 324/61 R |
| 3,355,664 | 11/1967 | Pranke | 324/61 R |
| 3,500,185 | 3/1970 | Eppler | 324/61 R |
| 3,917,995 | 11/1975 | Clinton | 324/517 |

*Primary Examiner*—Reinhard J. Eisenzopf
*Assistant Examiner*—Robert W. Mueller
*Attorney, Agent, or Firm*—A. Mich, Jr.

[57] ABSTRACT

Disclosed is an apparatus for determining the eccentricity of insulation on an elongated conductor comprising two flat parallel opposing electrodes positionable on opposite sides of an insulated conductor in physical contact with the insulation of the conductor, means for moving one of the two electrodes relative to the other in a direction parallel to the electrodes, whereby the insulated conductor is rotated therebetween, electrical contact means for making electrical contact to the conductor, means for translating the electrical contact means at the same rate that the insulating conductor is translated between the two flat opposing electrodes, and electrical means for determining the ratio of the capacitance of each of the two electrodes to the conductor as the insulating conductor is rotated between the two electrodes. Also disclosed is a method of determining the eccentricity of the insulation on an elongated conductor by placing the insulated conductor between and in contact with two flat parallel opposing electrodes, making electrical contact with the conductor, rotating and translating the insulating conductor between the two electrodes by moving one of the electrodes relative to the other of the electrodes in a direction parallel to the electrodes, simultaneously rotating and translating the electrical contact at the same rate that the insulating conductor is rotated, and electrically determining the ratio of the capacitance of each of the two electrodes to the conductor.

8 Claims, 3 Drawing Sheets

DETERMINING ECCENTRICITY OF INSULATED WIRE

BACKGROUND OF THE INVENTION

Magnet wire is insulated by passing a bare conductor through a bath of a liquid enamel, up through a die that removes excess enamel, then through an oven where the enamel is cured. Ideally, the conductor is in the exact center of the insulation, so that the thickness of insulation is uniform completely around the wire. However, for various reasons, the center of the insulation may not coincide with the center of the conductor, so that one side of the wire is inadequately insulated while the opposite side has more insulation than is needed. If the eccentricity of the insulation is too great, the wire must be rejected and scrapped.

The eccentricity of the insulation is usually determined by cutting a sample from each end of the spool of wire. Cross-sections taken from the two samples are prepared and are examined under the microscope to visually determine the eccentricity of the insulation. While this method is accurate, it is very time consuming, and can take from 15 minutes to several hours to complete. Also, only a single cross-section of each sample is examined, which may not be representative of the entire sample or the spool. As a result, if the insulation on the particular cross-section examined is more eccentric than the rest of the spool, the entire coil of wire may be mistakenly scrapped, and if the insulation on the particular cross-section examined is less eccentric than the rest of the spool, the coil of wire may be mistakenly accepted.

SUMMARY OF THE INVENTION

We have found that the eccentricity of insulation on a conductor can be quickly and accurately determined by placing the insulated conductor between two electrodes, and measuring the ratio of the two capacitances between the electrodes and the conductor while rolling the insulated conductor between the electrodes. A sample of wire is simply inserted into the apparatus and a crank is turned, which rotates the wire between two electrodes. The eccentricity, which is proportional to the maximum (or minimum) ratio of the capacitances, is automatically determined electrically.

Unlike the previous visual method, the method of this invention gives an average eccentricity of the insulation over a length of sample rather than a single cross-section. Also, the procedure is very rapid, usually requiring only 2 or 3 minutes or less, and its accuracy does not depend upon the skill of the operator.

DESCRIPTION OF THE INVENTION

Figure 1:
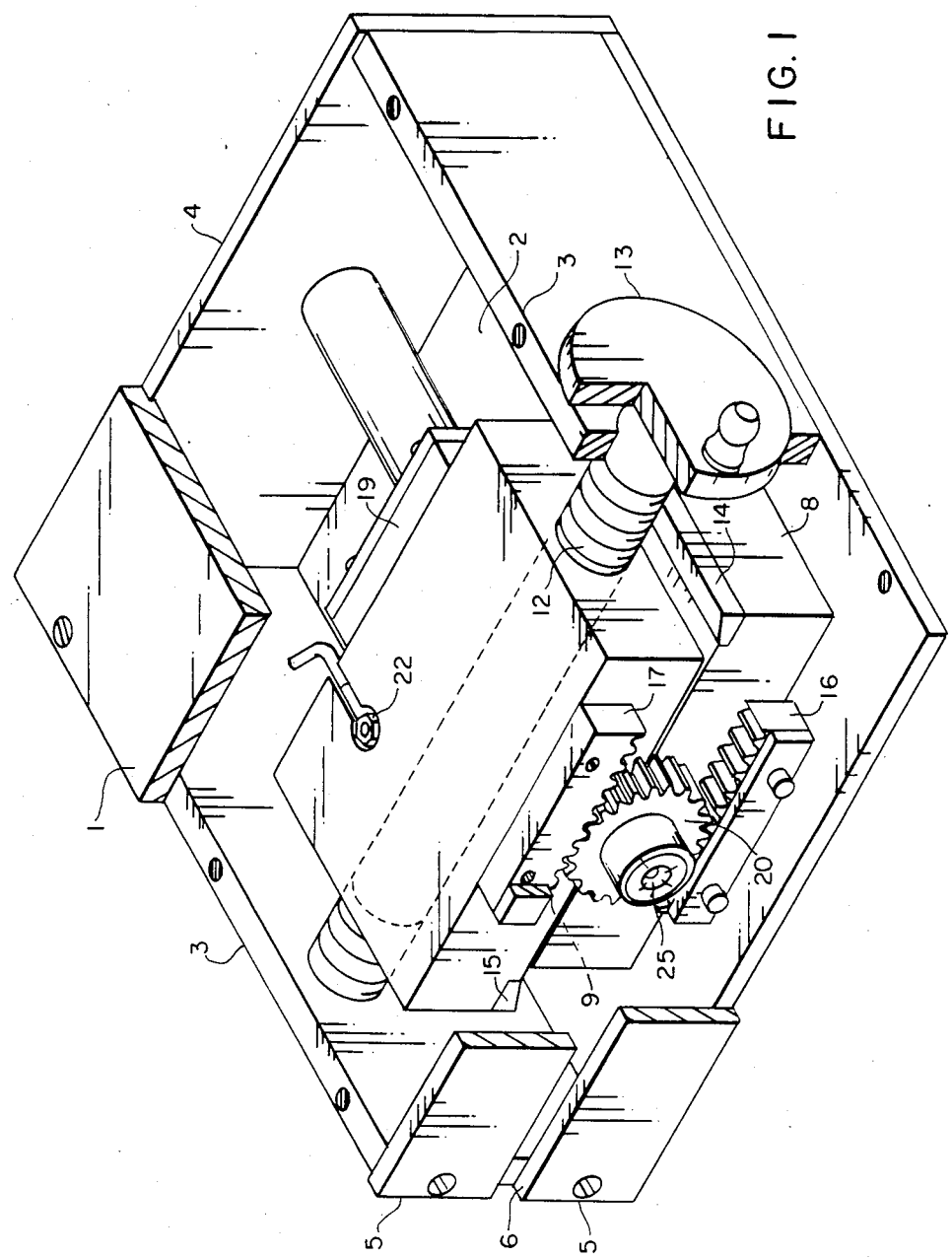
FIG. 1 is an isometric view partially in section illustrating a certain presently preferred embodiment of an apparatus according to this invention for determining the eccentricity of insulation on an insulated conductor.
Figure 2:
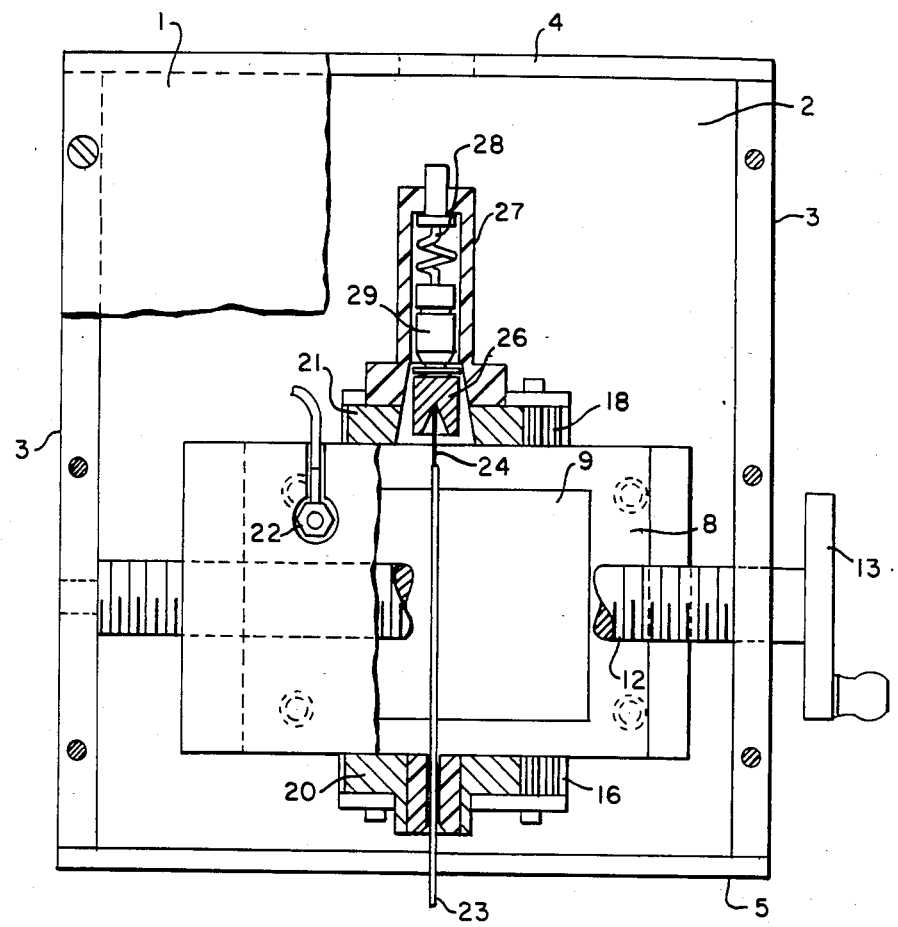
FIG. 2 is a top view, partially cut away, of the apparatus of FIG. 1.
Figure 3:
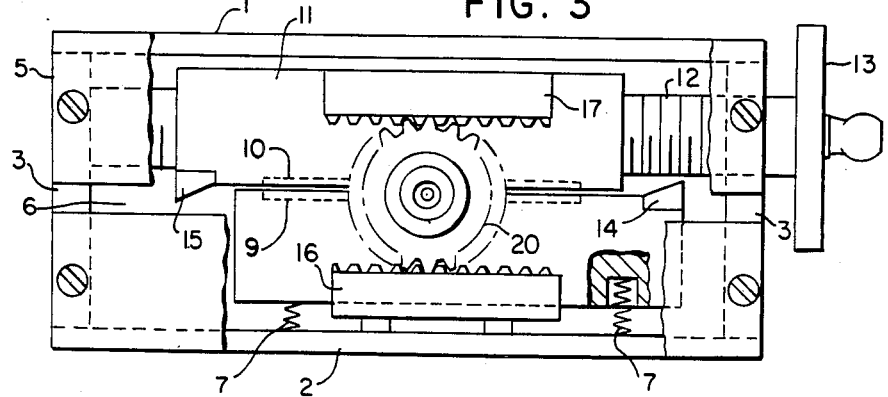
FIG. 3 is a side view, partially cut away, of the apparatus of FIG. 1.

In FIGS. 1, 2, and 3, a container is formed of top 1, base 2, sides 3, solid back panel 4, and front panel 5 having horizontal slot 6 thereacross. Mounted to base 2 by way of four springs 7 is block 8, of insulating material. Bottom electrode 9, of conducting material, is mounted on the top of block 8. An opposing top electrode 10, also a conductor, faces bottom electrode 9 and is mounted to block 11, also of insulating material. Threaded into block 11 is a screw 12 attached to crank 13. Screw 12 is held in position by sides 3. To blocks 8 and 11 are mounted ramps 14 and 15, respectively, which separate blocks 11 and 8 by compressing springs 7 so that an insulated wire can be inserted between them. Also mounted to blocks 8 and 11 are gear racks 16 and 17, respectively, at one side of the blocks, and similar gear racks 18 and 19, respectively, at the opposite side of the blocks. Gears 20 and 21 ride in gear racks 16 and 17, on one side, and in gear racks 18 and 19, on the opposite side, respectively. Attached to electrode 10 is electrical connection 22. (A similar electrical connection, not shown, is attached to electrode 9.)

To test the eccentricity of insulation 23 on conductor 24, screw 12 is turned until blocks 8 and 11 contact ramps 15 and 14, respectively, forcing block 8 downward by compressing springs 7. The bare end of the insulated conductor is inserted through slot 6 and aperture 25 in gear 20, between electrodes 9 and 10, and is pressed into the bottom of conducting conically-recessed piece 26, where the bare end of the conductor makes electrical contact with piece 26. Piece 26 is held in insulated housing 27; electrical connection with piece 26 is made through spring 28. Piece 26 is free to rotate with conductor 24, while spring 28 does not rotate; electrical connection between piece 26 and spring 28 is made by way of mercury wetted device 29 (known as a "Mercotac"). Spring 28 presses device 29 and piece 26 against the bare end of conductor 24. Turning crank 13 moves blocks 8 and 11 off ramps 15 and 14, respectively, pressing electrodes 9 and 10 against conductor 24. Continued turning of crank 13 moves electrode 10 horizontally over electrode 9, rolling insulated conductor 24 between them. Aperture 25 and the center of conical piece 26 move at exactly the same horizontal rate of speed that the center of insulated conductor 24 moves, so that no slippage occurs between conductor 24 and electrodes 9 and 10; conductor 24 moves horizontally at one-half the velocity (and distance) of block 11. As insulated conductor 24 is rotated, a voltage is placed on electrodes 9 and 10, and the ratio of the capacitances of the two electrodes to conductor 24 is determined.

Figure 4:
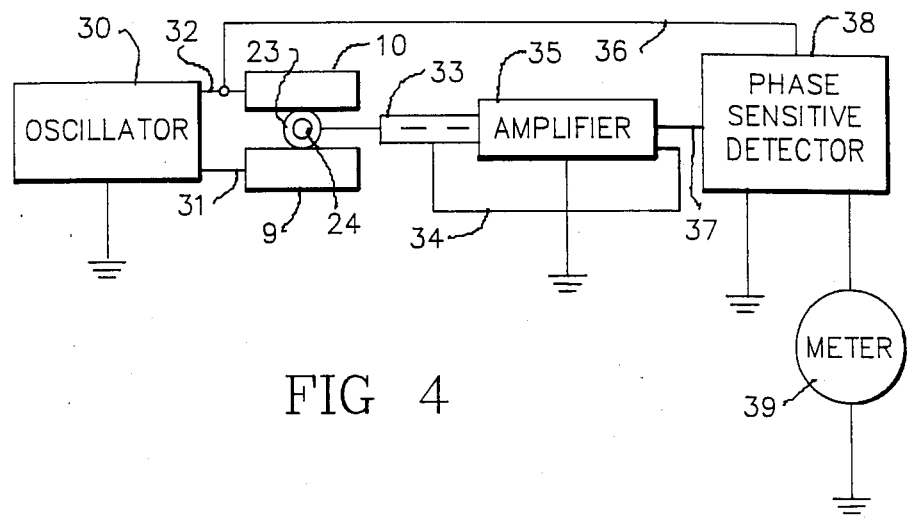
FIG. 4 is an electrical circuit diagram illustrating a certain presently preferred embodiment of the electrical circuitry according to this invention that is used to determined the ratio of the capacitances of two electrodes to a conductor.

FIG. 4 shows the electrical circuitry that is presently preferred for determining this ratio. In FIG. 4 an oscillator 30 produces an alternating current having a voltage that is a sine wave function in line 31, and, in line 32, a voltage that is the negative of that sine wave function. Line 31 is connected to electrode 9 and line 32 is connected to electrode 10 (or vice versa). Electrical connection to conductor 24 is made via lead 28, which is connected to shielded cable 33. The use of shielded cable 33 prevents the surrounding environment from creating a capacitance to conductor 24, which might affect the measurement. Amplifier 35 amplifies the signal from conductor 24. Line 34 drives the voltage on shield 33 with a fraction of the output voltage of amplifier 35 equal to the voltage on input conductor 24; thus, even though there is appreciable capacitance between conductor 24 and shield 33, the voltage across this capacitance will be zero and no capacitive current will flow therein. This capacitance therefore has no effect on the measurement. Leads 36 and 37 connect line 32 (or line 31) and the output of amplifier 35, respectively, to phase sensitive detector 38. The output of phase sensitive detector 38 is sent to meter 39 which displays a signal that is proportional to the ratio of two capacitances, the capacitance between electrode 9 and conductor 24, and the capacitance between electrode 10 and conductor 24. The maximum (or minimum) of this ratio, as conductor 24 is rotated, is monotonically dependent on (though not necessarily linearly proportional to) the eccentricity of the insulation on conductor 24.

Figure 5:
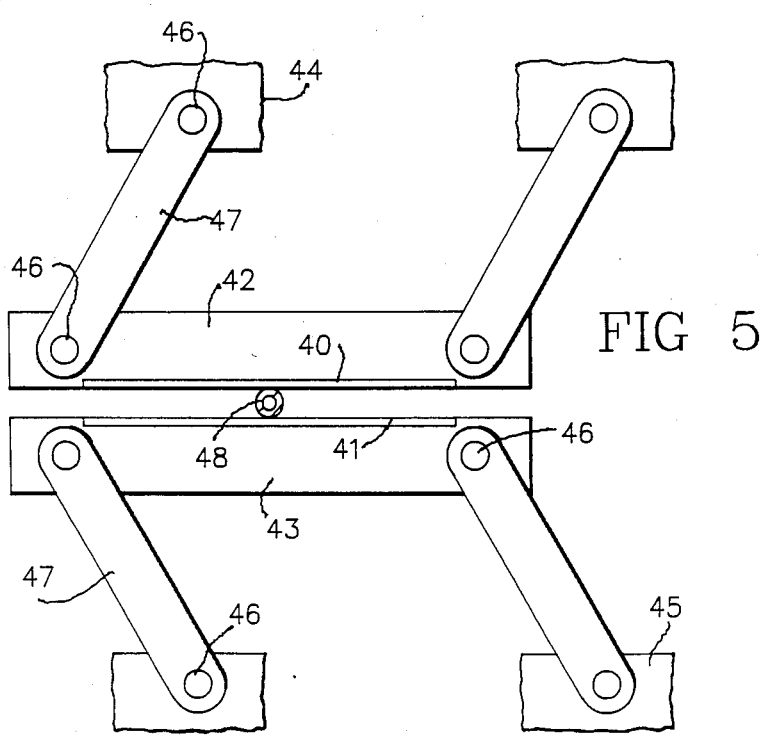
FIG. 5 is a side view illustrating an alternative certain presently preferred embodiment of an apparatus according to this invention for rotating an insulated wire.

FIG. 5 illustrates an alternative apparatus for rotating an insulated conductor. In FIG. 5, electrodes 40 and 41 are mounted on blocks 42 and 43, respectively. To each block 40 and 41, and to fixed structures 44 and 45, respectively, are attached, by pins 46, four struts 47 (only two of which are shown for each block). Insulated conductor 48 is held between electrodes 40 and 41 in contact therewith. Moving blocks 42 and 43 in unison in a vertical direction causes insulated conductor 48 to be rotated between them. The apparatus of FIG. 5 is more suitable for testing wire sizes smaller than about #24 (0.0201 inch diameter). In use, the end of a long sample of wire is inserted between electrodes 40 and 41. The other end of the wire is bared for the electrical connection to conductor 48 by means of a long flexible conductor equipped with an alligator clip. The long sample and long connecting conductor are needed to impart sufficient flexibility into the system to allow the wire to rotate between electrodes 40 and 41 without the necessity for a sliding contact. The rack and gear system and Mercotac system shown in FIG. 3 could be used with the apparatus of FIG. 5.

We claim:
1. Apparatus for determining the eccentricity of insulation on an elongated conductor comprising
   (1) two flat parallel opposing electrodes positionable on opposite sides of said insulated conductor, in physical contact with said insulation;
   (2) means for moving one of said two electrodes relative to the other of said two electrodes in a direction parallel to said electrodes, whereby said insulated conductor is rotated therebetween;
   (3) electrical contact means for making electrical contact to said conductor;
   (4) means for translating said electrical contact means at the same rate that said insulated conductor is translated between said two flat opposing electrodes; and
   (5) electrical means for determining the maximum or minimum ratio of the capacitance of each of said two electrodes to said conductor as said insulated conductor is rotated between said two electrodes.

2. Apparatus according to claim 1 wherein said means for moving one of said two electrodes is a screw threaded into one of said two electrodes.

3. Apparatus according to claim 1 wherein said means for moving one of said two electrodes is struts rotatably attached to fixed structures at one end and rotatably attached to said electrodes at the other end.

4. Apparatus according to claim 1 wherein said means for translating said electrical contact means is a gear that rides in two gear racks, one in each of said two electrodes, where said electrical contact means is mounted to said gear.

5. A method of determining the eccentricity of insulation on an elongated conductor comprising
   (1) placing said insulated conductor between and in physical contact with two flat parallel opposing electrodes;
   (2) making an electrical contact with said conductor;
   (3) rotating said insulated conductor between said two electrodes by moving one of said electrodes relative to the other of said electrodes in a direction parallel to said electrodes;
   (4) simultaneously translating said electrical contact at the same rate that said insulated conductor is translated; and
   (5) electrically determining the maximum or minimum ratio of the capacitance of each of said two electrodes to said conductor.

6. A method according to claim 5 wherein one of said electrodes is moved by turning a screw that is threaded into one of said electrodes.

7. A method according to claim 5 wherein each of said two electrodes is rotatably attached by struts to a fixed structure and one of said electrodes is moved relative to the other, while maintaining said electrodes in parallel.

8. A method according to claim 5 wherein said electrical contact is translated by a gear centered on said conductor that rides in two gear racks, one on each of said two electrodes, where said electrical contact means is mounted to said gear.

* * * * *